United States Patent
Lin

(10) Patent No.: US 9,410,998 B2
(45) Date of Patent: Aug. 9, 2016

(54) METHOD, SYSTEM AND APPARATUS FOR CAPACITIVE SENSING

(71) Applicant: Li Lin, Wilmington, DE (US)

(72) Inventor: Li Lin, Wilmington, DE (US)

( * ) Notice: Subject to any disclaimer, the term of this patent is extended or adjusted under 35 U.S.C. 154(b) by 205 days.

(21) Appl. No.: 14/090,333

(22) Filed: Nov. 26, 2013

(65) Prior Publication Data
US 2015/0145531 A1     May 28, 2015

(51) Int. Cl.
*G01R 31/26* (2014.01)
*G01R 27/26* (2006.01)
*G01D 5/241* (2006.01)

(52) U.S. Cl.
CPC .......... *G01R 27/2605* (2013.01); *G01D 5/2415* (2013.01)

(58) Field of Classification Search
CPC .......................... G01R 27/2605; G01D 5/2415
USPC .................................................. 324/661–662
See application file for complete search history.

(56) References Cited

U.S. PATENT DOCUMENTS

| | | | | |
|---|---|---|---|---|
| 6,142,632 A * | 11/2000 | Inatome | ................. | G03B 21/32 324/688 |
| 6,497,141 B1 * | 12/2002 | Turner | ................. | H03H 9/2405 310/309 |
| 6,507,138 B1 * | 1/2003 | Rodgers | ................. | B81B 3/0021 310/309 |
| 6,792,805 B2 * | 9/2004 | Murata | ................. | G01P 15/125 73/514.32 |
| 7,046,497 B1 * | 5/2006 | Bonin | ................. | H01G 5/14 361/272 |
| 2002/0190727 A1 * | 12/2002 | Morimoto | ................. | G01L 5/165 324/661 |
| 2004/0104727 A1 * | 6/2004 | Morimoto | ................. | G01D 5/2417 324/409 |
| 2008/0278178 A1 * | 11/2008 | Philipp | ................. | G06F 3/044 324/662 |
| 2010/0038753 A1 * | 2/2010 | Ni | ................. | H01G 5/18 257/532 |

* cited by examiner

*Primary Examiner* — Patrick Assouad
*Assistant Examiner* — Demetrius Pretlow
(74) *Attorney, Agent, or Firm* — Maier & Maier, PLLC

(57) ABSTRACT

A system for obtaining incremental and absolute displacement measurements using systems of electrodes that interact to form variable capacitors and systems that facilitate implementation of the method along with exemplary embodiments of these systems. The capacitors created by the disclosed method have known physical properties and corresponding known mathematical relationships. These laws are exploited in such a way by our method as to overcome inadequacies in existing systems and create superior systems. These superior systems improve upon the existing art by including economically and reliably made sensors based on the area varying principle which eliminate dead zone issues and increase accuracy through a reduction of the influence of gap variations on capacitive systems through the use of compensatory geometrical arrangements of multiple capacitive systems.

12 Claims, 23 Drawing Sheets

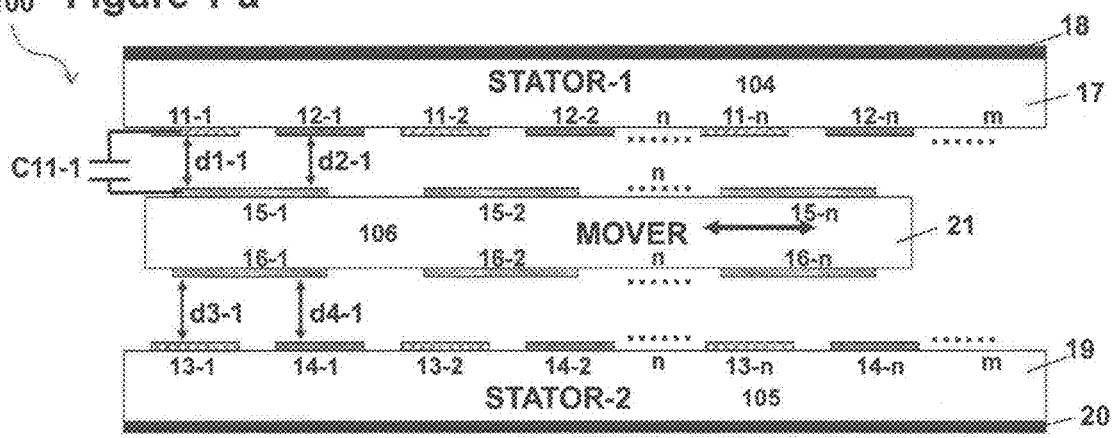

Figure 1-b
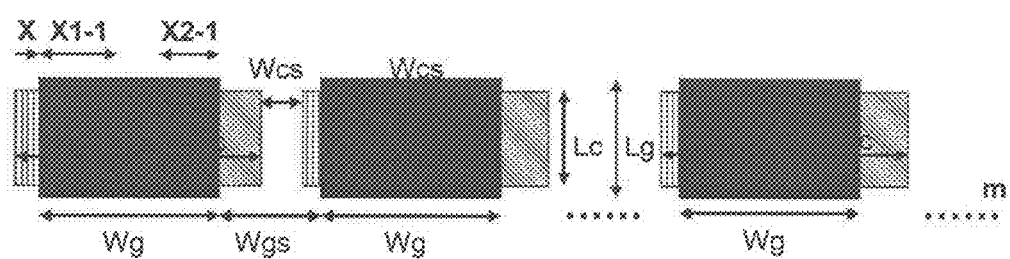

203 Figure 9

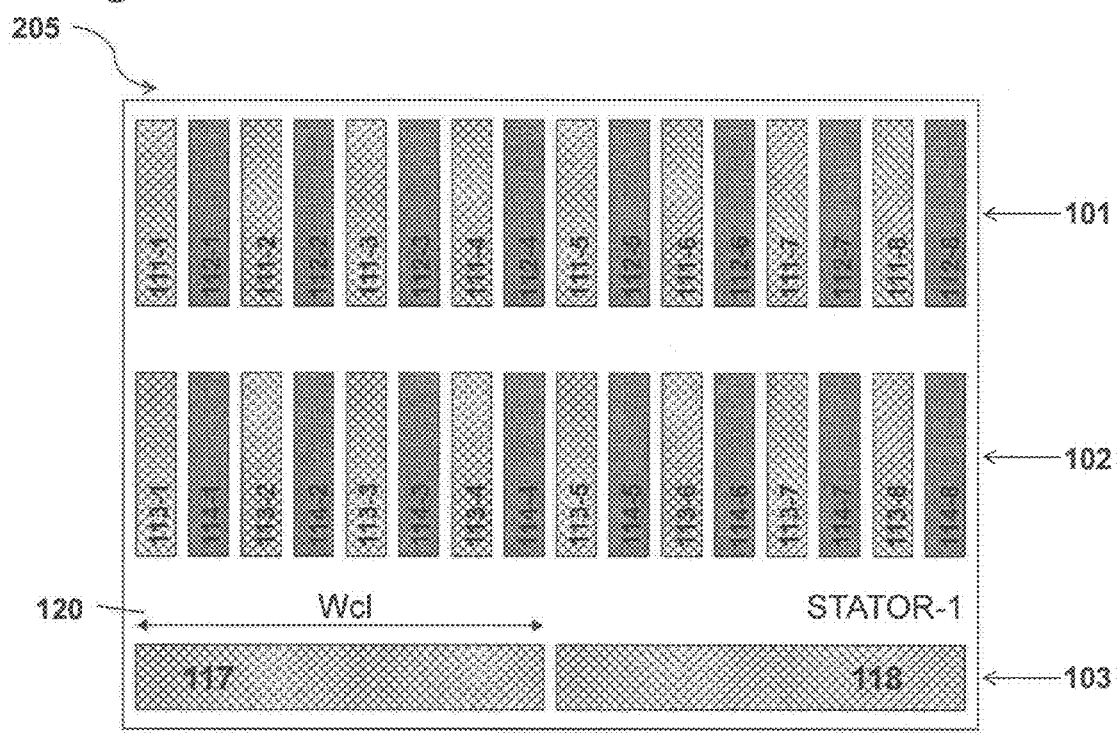
Figure 12-a

Figure 12-b
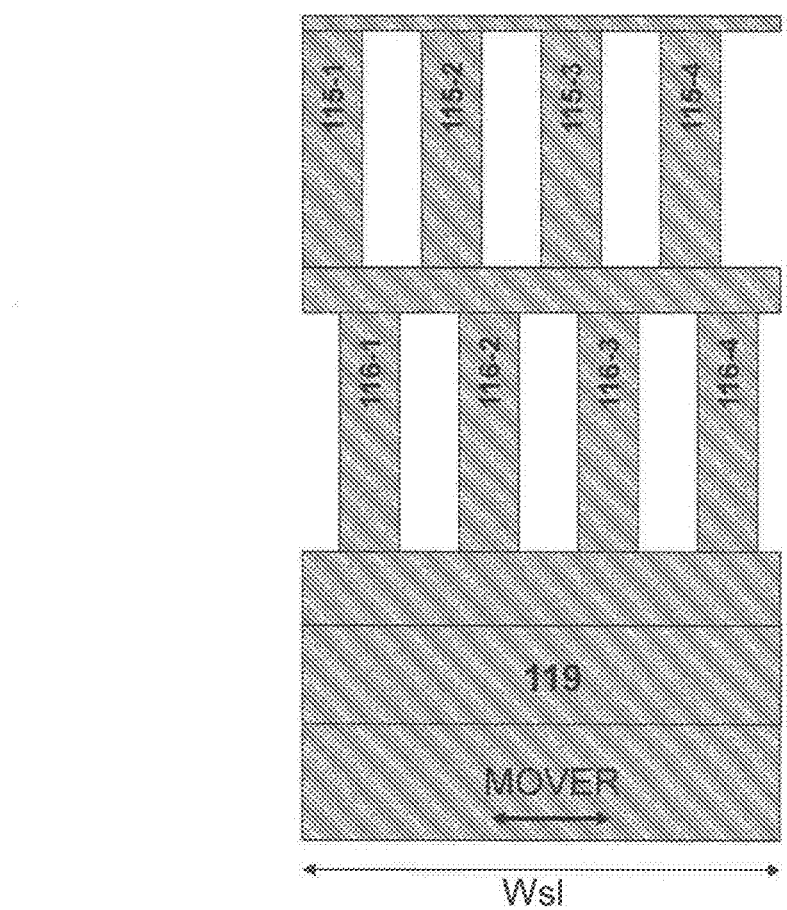

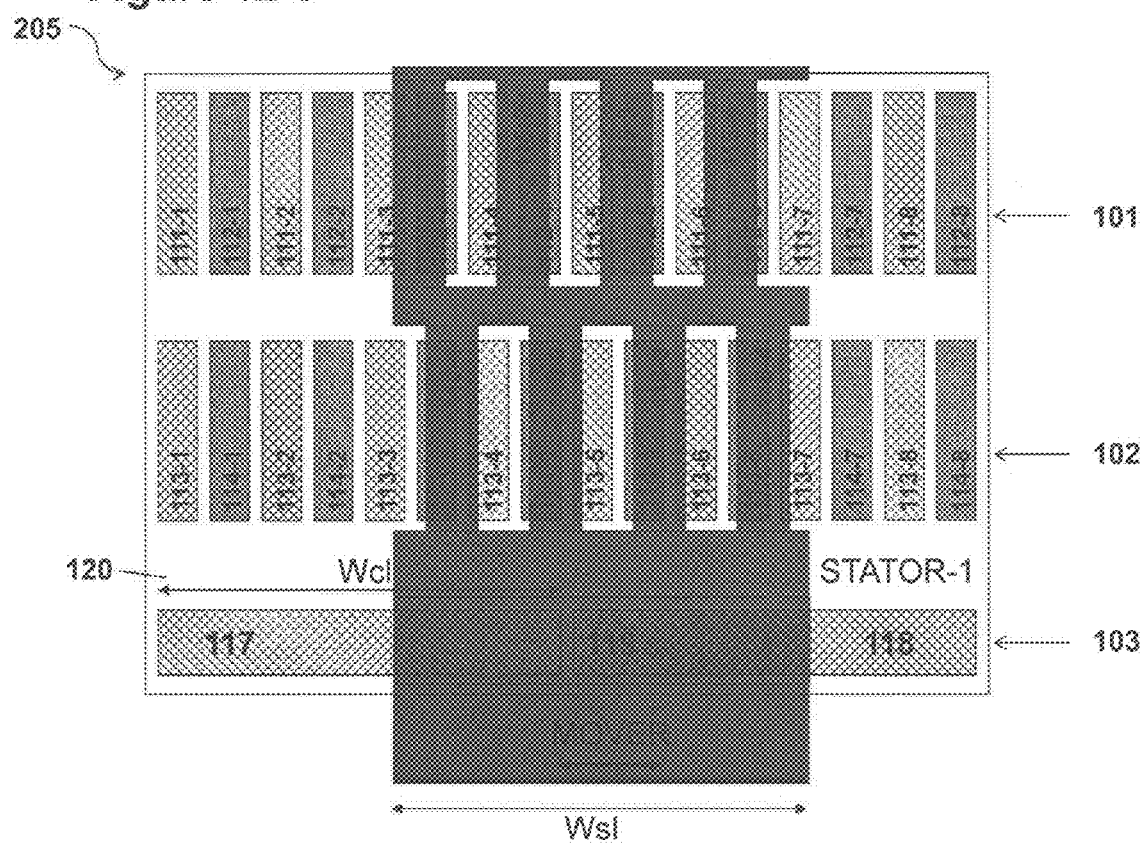
Figure 12-c

Fig. 13-a
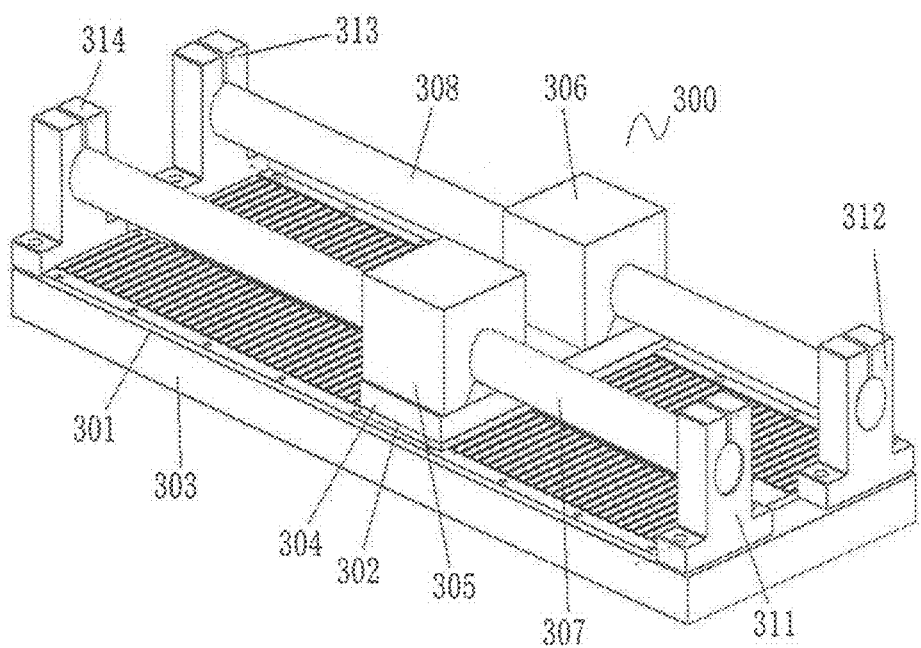

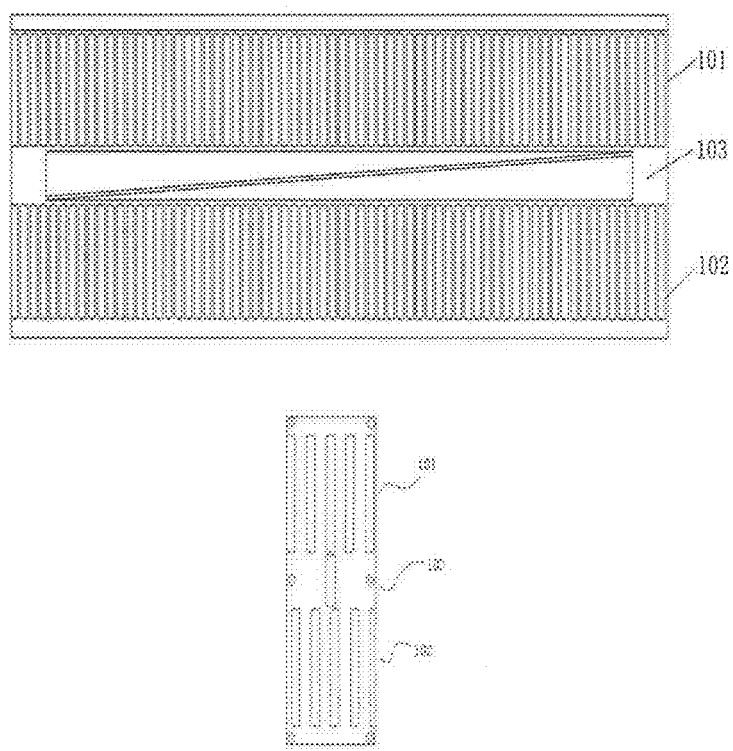
Fig. 13-b

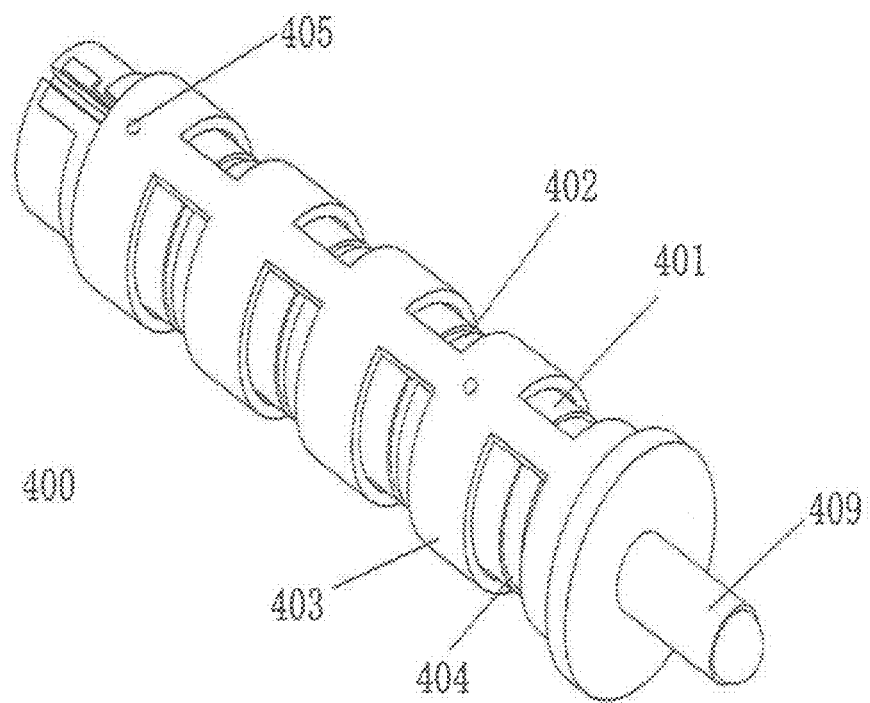
Fig. 14-a

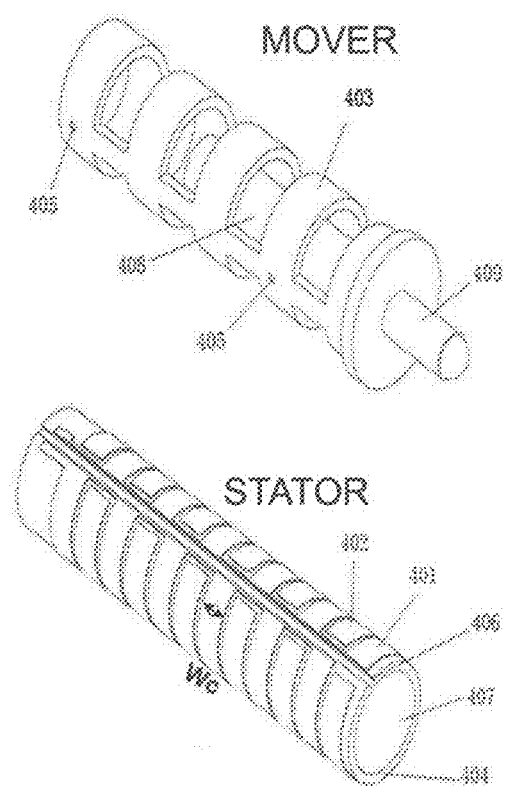
Fig. 14-b

Fig. 15-a
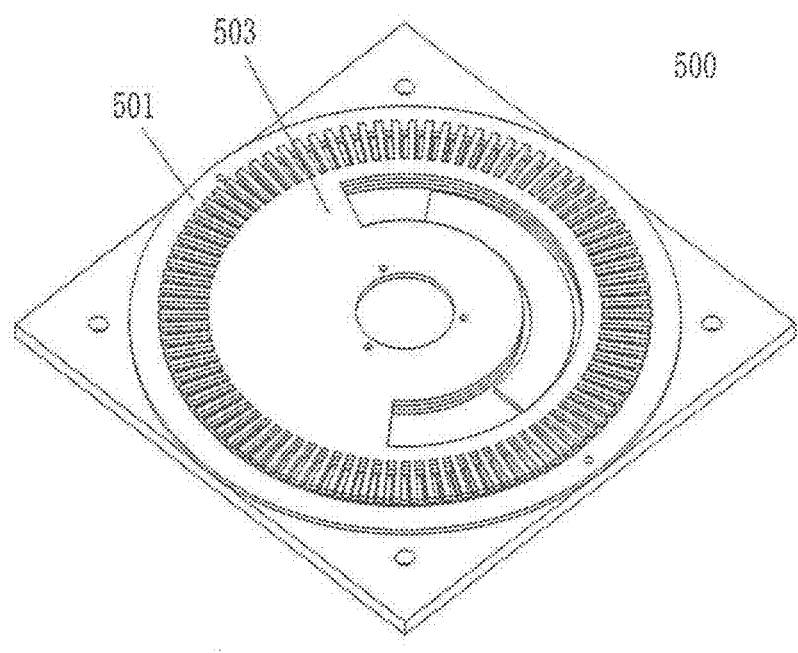

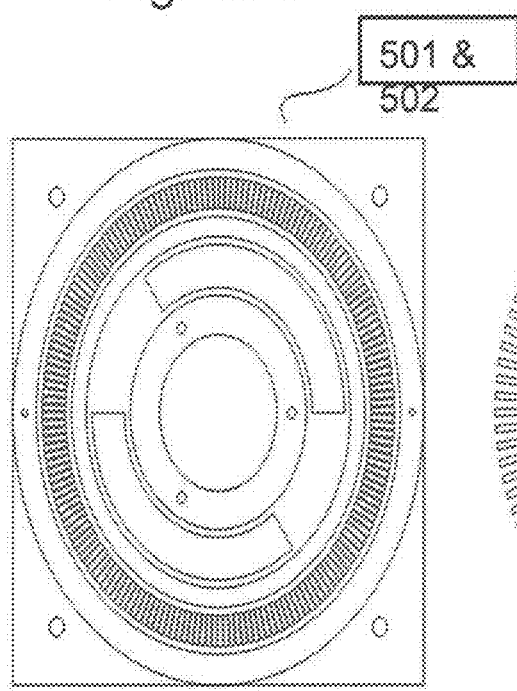# Fig. 15-b
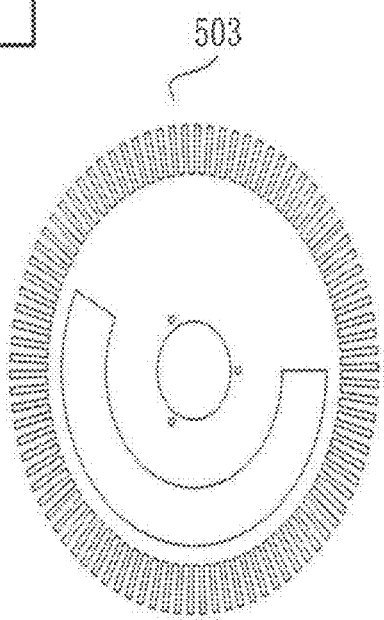# Fig. 15-c
501 & 502
503

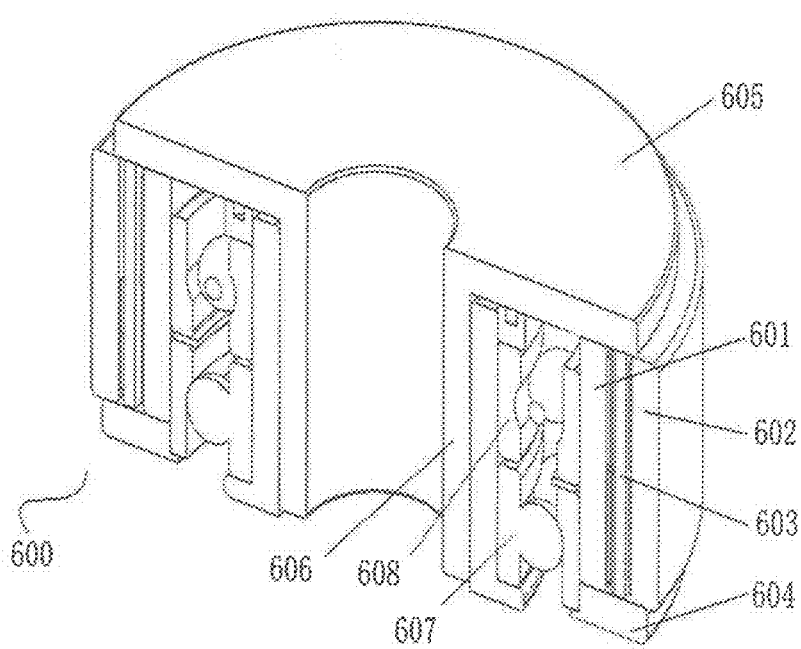
Fig. 16-a

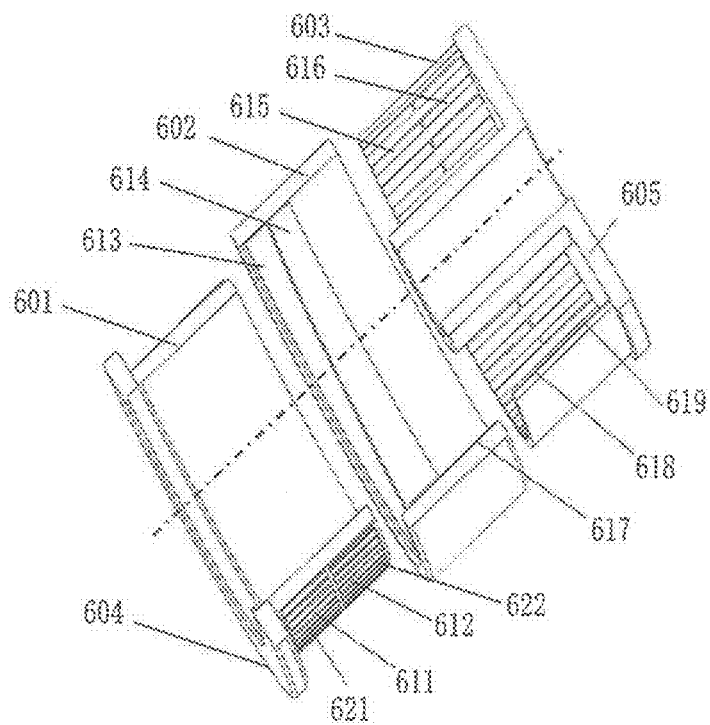
Fig. 16-b

METHOD, SYSTEM AND APPARATUS FOR CAPACITIVE SENSING

BACKGROUND

The use of capacitors is known for the effective storing of electrical charges. The capacitance of a capacitor with two parallel electrodes is known to be approximately proportional to the dielectric constant of the medium between the two electrodes, proportional to the overlapped area of the two electrodes, and inversely proportional to the gap distance between the two electrodes. The capacitance changes when a displacement of one electrode with respect to another changes the overlapped area and/or changes the gap distance. Those skilled in the art applied these scientific principles (or relationships) and fabricated various capacitive sensors including displacement (position) measuring ones.

Based on the above scientific principles, a displacement can be measured in two different ways. One method is detecting capacitance variation due to a gap variation between two parallel electrodes, where the motion is perpendicular to the electrode surfaces. Because a capacitance of a capacitor is extremely sensitive to its gap variation, particularly when the gap is small, this kind of method is found in nano-positioning applications. Those sensors can sense a displacement as small as a few picometers, while they are limited to a measurement range of a few hundred micrometers. Another issue for this kind of sensor is nonlinearity due to the inversely proportional relationship between the capacitance and the gap distance of a capacitor, although this problem can be resolved with a digital linearization technique.

Another method is detecting a capacitance variation due to a size variation of an overlapped area between two parallel electrodes, where the motion is parallel to the surfaces of the electrodes. A commercially available sensor based on the area varying principle is desirable, but hard to find. Implementing the area varying principle perfectly in practice has proven to be a significant challenge. It is very difficult to measure the size variation of an overlapped area by having a motion in a parallel direction to the electrode surface without any variation of the gap distance due to motion perpendicular to the electrode surfaces. As mentioned above, the capacitance of a capacitor is extremely sensitive to its gap distance. It can be estimated, for example, that increasing or decreasing a capacitor gap of 100 micrometers by one micrometer, creates a capacitance variation of one percent. A 100 micrometer gap is in the practical range while a one micrometer tolerance for mechanical moving parts is quite a challenge for economical mass production. The one percent uncertainty error is unacceptable in terms of accuracy for most applications. As a result of difficult gap variation control, a sensor based on area variation is impractical unless useful compensation techniques are developed to reduce influence of gap variation.

There is another challenging problem for an area varying capacitive sensor to have a both highly sensitive and long range measurement. An area varying capacitive sensor cannot have a long range measurement because of the cyclic nature of its output signal. Transition points exist where a signal changes from increase to decrease or vice versa. The measurement uncertainties near the transition points are usually too big to be acceptable in terms of accuracy for most applications. This makes a sensor based on area variation impractical for long range measurement unless a solution is found to eliminate the uncertainties.

SUMMARY

A composite capacitor measurement system which may be used for incremental and absolute displacement measurement. Each system can have one or more subsystems (STATORs) which themselves may have an electrically insulated substrate having capacitive electrodes located a predetermined distance from one another. These STATOR subsystems can work in conjunction with one or more subsystems (MOVERs) which can have an electrically insulated substrate with one or more ground electrodes. One or more of the subsystems may be mobile and may move in a controlled, predetermined manner with respect to one or more predetermined subsystems which may be stationary relative to the global system.

One exemplary embodiment described herein may be a composite capacitive displacement measurement system. The composite capacitive displacement system can have one or more composite components (STATORs) that are stationary with respect to a predetermined globe system. Each of the composite components can include an electrically insulated substrate having at least a pair of electrically conductive capacitive electrodes located a predetermined distance from one another, where the electrodes are alternatively electrically connected together to form two capacitive series. Also, the system can have one or more composite components (MOVERs) that are mobile and move in a controlled manner with respect to the predetermined corresponding components that are stationary relative to the globe system. Each of these components can have an electrically insulated substrate having at least one ground series of electrically conductive ground electrodes located a predetermined distance from one another, where the ground electrodes are electrically connected together to form a ground series. Further, the system can have one or more circuits with an electronic signal processing unit; a system ground; conducting components connecting the ground series to the system ground; and conducting components connecting the capacitive series to the electronic signal processing unit.

In another exemplary embodiment, a system for providing for substantially simultaneous creation and destruction of variable capacitors in respectively equal amounts may be described. The system can have one or more stationary composite components (STATORs) that are stationary with respect to a predetermined globe system. Each of the components can include an electrically insulated substrate having one pair of two capacitive series of m electrically conductive elementary electrodes located a predetermined distance from one another, where the elementary electrodes are electrically connected together within their own series. The system can also have one or more mobile composite components (MOVERs) that move in a controlled manner with respect to the predetermined corresponding components that are stationary relative to the globe system. Additionally, the system may have an electrically insulated substrate having one ground series of n electrically conductive elementary electrodes located a predetermined distance from one another where the elementary electrodes are electrically connected together within their own series. Also, the system may be such wherein there are more of the capacitive electrodes than the ground electrodes (m>n) such that as at least one MOVER moves with respect to at least one STATOR, capacitive electrodes on the STATOR that previously formed capacitors with ground electrodes of the MOVER are no longer formed capacitors and, simultaneously, capacitive electrodes on STATOR which had not formed capacitors now form capacitors because of the movement of the ground electrodes of the MOVER.

BRIEF DESCRIPTION OF THE FIGURES

FIG. 1-*a* is an exemplary side view of one possible embodiment containing two STATORs and one double sided MOVER and showing the geometric configuration of their components.

FIG. 1-*b* is an exemplary top down view of one STATOR and one side of a double sided MOVER interacting and showing the geometric configuration of their components.

FIG. 12-*a* is an exemplary top down view of just the STATOR and its components in one possible embodiment, the same embodiment that the MOVER in FIG. 12-*b* would be a part of, and the same embodiment shown in FIG. 12.

FIG. 12-*b* is an exemplary top down view of just the MOVER and its components in one possible embodiment, the same embodiment that the STATOR in FIG. 12-*a* would be a part of, and the same embodiment shown in FIG. 12.

FIG. 12*c* is an exemplary top down view of one possible embodiment containing one STATOR and one MOVER and showing the geometric configuration of their components; it is also the embodiment whose STATOR was shown in FIG. 12-*a* and MOVER was shown in FIG. 12-*b*.

FIG. 13-*a* is an exemplary isometric view of one possible embodiment of a completely assembled sensor system for an absolute linear displacement measurement.

FIG. 13-*b* is an exemplary STATOR from FIG. 13-*a* as viewed from the top down and also the MOVER from FIG. 13-*a* as viewed from the bottom up.

FIG. 14-*a* is an exemplary isometric view of one possible embodiment of a completely assembled sensor system for an absolute linear displacement measurement.

FIG. 14-*b* is an exemplary isometric view of the STATOR from FIG. 14-*a* and also the MOVER from FIG. 14-*a*.

FIG. 15-*a* is an exemplary isometric view of one possible embodiment of a completely assembled sensor system for an absolute angular displacement measurement.

FIG. 15-*b* is an exemplary top down view of the STATORs of the embodiment shown in FIG. 15-*a*.

FIG. 15-*c* is an exemplary top down view of the MOVER of the embodiment shown in FIG. 15-*a*.

FIG. 16-*a* is an exemplary isometric view of a cross section of a complete angular displacement sensor system for an absolute angular displacement measurement of a full 360-degree measurement range.

FIG. 16-*b* is an exemplary view of the STATORs and MOVER in an unassembled configuration.

DETAILED DESCRIPTION

Figure 2:
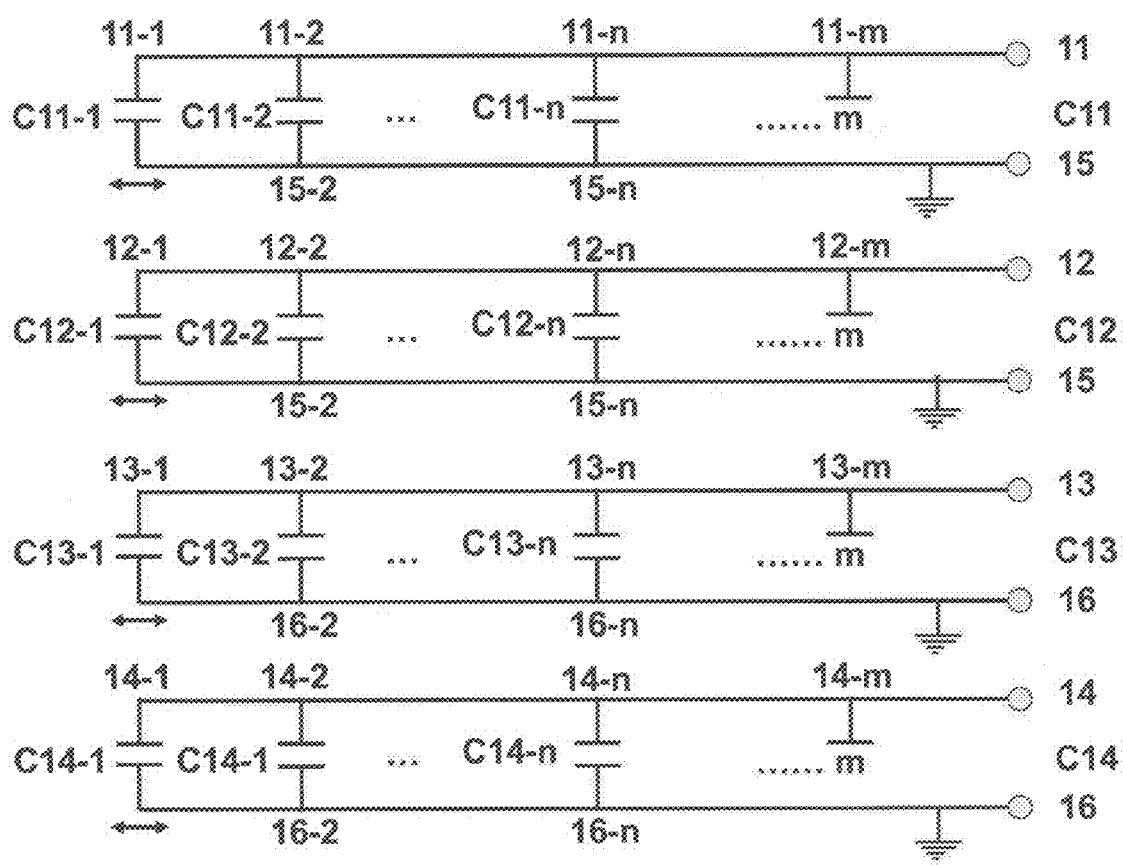
FIG. 2 is an exemplary electrical drawing that demonstrates how capacitors are created and destroyed using the embodiment shown in FIG. 1-*a* and how the resulting capacitors are numbered.

Aspects of the invention are disclosed in the following description and related drawings directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description discussion of several terms used herein follows.

As used herein, the word "exemplary" means "serving as an example, instance or illustration." The embodiments described herein are not limiting, but rather are exemplary only. It should be understood that the described embodiment are not necessarily to be construed as preferred or advantageous over other embodiments. Moreover, the terms "embodiments of the invention", "embodiments" or "invention" do not require that all embodiments of the invention include the discussed feature(s), advantage(s) or mode(s) of operation(s).

Generally referring to FIGS. 1-16, exemplary embodiments described herein may measure linear and/or angular displacement (or position) based on overlapped area variations of multiple capacitive systems. Exemplary 2D and 3D geometrical compensational arrangements of capacitive systems described herein can reduce the capacitive influence of gap variations that may cause an accuracy problem with measurements and can also overcome a known measurement "dead zone" problem. The "dead zone" solution can make long range measurements with nanometer resolution possible. Additionally, certain exemplary embodiments can reduce the extremely high accuracy requirements of supporting components.

In a first exemplary embodiment shown in FIG. 1-*a*, a capacitive sensor system 100 can have a variety of sub-systems. These sub-systems can include a capacitive series 11 having m elements of substantially equally spaced electrically conductive electrodes 11-1, 11-2, ..., 11-*m*; a capacitive series 12 of m elements of substantially equally spaced electrically conductive electrodes 12-1, 12-2, ..., 12-*m*; a capacitive series 13 of m elements of substantially equally spaced electrically-conductive electrodes 13-1, 13-2, ..., 13-*m*; a capacitive series 14 of m elements of substantially equally spaced electrically conductive electrodes 14-1, 14-2, ..., 14-*m*; a ground series 15 of n elements of substantially equally spaced electrically conductive electrodes 15-1, 15-2, ..., 15-*n*; and a ground series 16 of n elements of substantially equally spaced electrically conductive electrodes 16-1, 16-2, ..., 16-*n*. The numbers m of the electrodes of capacitive series 11, 12, 13, and 14 may all be equal to each other. The number m can be any positive integer. The numbers n of grounded electrodes 15 and 16 may be equal to each other. The number n can be any positive integer as well.

Still referring to exemplary FIG. 1-a, the number n of grounded electrodes may be smaller than or equal to the number m of capacitive series. The capacitive series 11 and 12 can be on the same side of an electrically-insulated substrate 17 with electrical shielding 18 on the other side of the substrate. The two capacitive series 11 and 12, the insulation substrate 17, and the shielding layer 18 together can form a composite component, known, for example, as STATOR-1 104 of the sensor system. The capacitive series 13 and 14 may be on the same side of an electrically-insulated substrate 19 with electrical shielding 20 on the other side of the substrate. The two capacitive series 13 and 14, the insulation substrate 19, and the shielding layer 20 together may form another composite component, known, for example, as STATOR-2 105 of the sensor system. The ground series 15 and 16 can be on two different sides of a common electrically-insulated substrate 21. The ground series 15 and 16, together with the insulation substrate 21, can form a composite component known, for example, as MOVER 106 of the sensor system. It may further be appreciated that any of the STATORs or MOVERs described herein may be composite components.

The STATOR-1 104 and STATOR-2 105 may be substantially parallel to each other. The MOVER 106 can displace in a substantially parallel manner with respect to the STATOR-1 104 and STATOR-2 105. It may be noted, however, that STATOR and MOVER are just assigned names for the purpose of describing aspects of the exemplary embodiments. A STATOR can be either stationary or mobile with respect to a global stationary coordinate or a moving coordinate as desired.

Still referring to exemplary FIG. 1-a, the gap between the first electrode 11-1 of the capacitive series 11 and the first electrode 15-1 of the ground series 15 is represented as d1-1. The gap between the first electrode 12-1 of the capacitive series 12 and the first electrode 15-1 of the ground series 15 is represented as d2-1. The gap between the first electrode 13-1 of the capacitive series 13 and the first electrode 16-1 of the ground series 16 is represented as d3-1. The gap between the first electrode 14-1 of the capacitive series 14 and the first electrode 16-1 of the ground series 16 is represented as d4-1. To form a combination of direct compensation and differential compensation as described below, the gaps d1-1, d2-1, d3-1, and d4-1 may all be substantially equal to each other. In the exemplary embodiment, with an arrangement as shown in FIG. 1, the gaps d1-1, d2-1, d3-1, and d4-1 can be slightly different within practical fabrication and assembly tolerances without significantly reducing measurement accuracy.

In exemplary FIG. 1-b the widths and lengths of the electrodes of capacitive series 11, 12, 13 and 14 are represented as Wc and Lc, respectively. The spaces between electrodes of capacitive series 11 and adjacent electrodes of capacitive series 12 are represented as Wcs. The spaces between electrodes of capacitive series 13 and adjacent electrodes of capacitive series 14 are also Wcs. The width and length of the ground series 15 and 16 are represented as Wg and Lg. The spaces between adjacent electrodes of ground series 15 are Wgs. The spaces between adjacent electrodes of ground series 16 are also Wgs. In some exemplary embodiments, Lg can be either larger or smaller than Lc but not equal to Lc as this size difference can eliminate a misalignment error.

Continuing with exemplary FIG. 1-b, the width of the overlap between capacitive electrode 11-1 and ground electrode 15-1 is X1-1, and the overlap area A1-1 may be substantially equal to the multiplication of width X1-1 and the length Lc. The overlap width between capacitive electrode 12-1 and ground electrode 15-1 is X2-1, and the overlap area A2-1 may be substantially equal to the multiplication of width X2-1 and the length Lc. The overlap width between capacitive electrode 13-1 and ground electrode 16-1 may be substantially equal to X3-1, and the overlap area A3-1 may be substantially equal to multiplication of width X3-1 and the length Lc. The overlap width between capacitive electrode 14-1 and ground electrode 16-1 may be substantially X4-1, and the overlap area A4-1 may be substantially equal to multiplication of width X4-1 and the length Lc. These overlaps may be linear functions of displacement X of the MOVER 106. For example, for the first electrode 11-1 of capacitive series 11, A1-1 may be determined as:

$$A1\text{-}1 = X1\text{-}1 * Lc = (Wc - X) * Lc \quad \text{[equation 1]}$$

and, for the first electrode 12-1 of capacitive series 12, A2-1 may be determined as:

$$A2\text{-}1 = X2\text{-}1 * Lc = (Wg + X - Wc - Wcs) * Lc \quad \text{[equation 2]}$$

The area variations resulting capacitance change as described below may represent an exemplary method of displacement measurement.

With the above exemplary geometrical arrangement, an electrode K-i of a capacitive series and an electrode G-j of a ground series can form a variable elementary capacitor CK-j, where K may represent the $K^{th}$ capacitive series and can be 11, 12, 13 or 14; and i may represent the $i^{th}$ electrode in the capacitive series, and can be any number of 1, 2, ..., m; G may represent the $G^{th}$ ground series and can be 15 or 16; and j can represent the $j^{th}$ electrode in the ground series and can be any number of 1, 2, ..., n; CK-j can represent the elementary capacitor formed by an electrode of the $K^{th}$ capacitive series and $j^{th}$ electrode of a ground series. For example, electrode 11-1 of capacitive series 11 and electrode 15-1 of ground series 15 can form elementary capacitor C11-1 with a capacitance proportional to the value of (A1-1/d1-1). Furthermore, 11-2 of capacitive series 11 and 15-2 of ground series 15 can form elementary capacitor C11-2; 12-1 and 15-1 can form C12-1; 13-1 and 16-1 can form C13-1; 14-1 and 16-1 can form C14-1; 11-n and 15-n can form C11-n; 12-n and 15-n can form C12-n; 13-n and 16-n can form C13-n; 14-n and 16-n can form C14-n; and so on. The capacitance of capacitor C11-2 may be proportional to the value of (A1-2/d1-2), the C12-1 the value of (A2-1/d2-1), the C13-1 the value of (A3-1/d3-1), the C14-1 the value of (A4-1/d4-1), and so on.

There are numbers (m-n) of electrodes of the capacitive series 11, 12, 13, and 14, which may not be able to form elementary capacitors with an electrode of ground series 15 or 16 at the illustrated position in exemplary FIG. 1-a. But as the MOVER 106 displaces to the right, there may be new elementary capacitors created at the same time when some existing capacitors are destroyed. The number of newly created and destroyed elementary capacitors may be substantially equal to each other. Therefore the number of elementary capacitors may be substantially the same throughout any movement, while the total capacitances of the systems may vary as the overlapped areas vary.

Elementary capacitors formed by electrodes of capacitive series K and electrodes of ground series G may be in parallel connections. They can form capacitive systems CK. In the exemplary embodiment shown in FIG. 1-a, there are four capacitive systems, C11, C12, C13 and C14. Equivalent circuit diagrams of the elementary capacitors and the capacitive systems are shown in exemplary FIG. 2 as a further embodiment. Exemplary FIG. 2 can also illustrate that as the MOVER 106 displaces to the right, there may be new elementary capacitors created at the same time that existing capacitors are destroyed. The numbers of newly created and destroyed elementary capacitors may be substantially equal to each other. The number of elementary capacitors may be the same throughout any movement.

The capacitive systems C11 and C13 can be arranged in a superposition configuration so that values of (C11+C13) or (C11*C13) can be obtained. The capacitive systems C12 and C14 can be arranged in superposition configuration so that values of (C12+C14) or (C12*C14) may be obtained.

In the above exemplary embodiment as shown in FIG. 1-a, the elementary electrodes of capacitive series 11 and ones of capacitive series 13 may be on different planes, but can be in alignment with respect to each other. There can also be an allowable degree of error due to fabrication and assembly. Similarly, the elementary electrodes of capacitive series 12 and those of capacitive series 14 can be on different planes, but may be in alignment with each other, while also possibly having an allowable small degree of error due to fabrication and assembly. The elementary electrodes of ground series 15 and 16 can be on different planes, but may be in alignment with each other, while also possibly having an allowable degree of error due to fabrication. The elementary capacitors with capacitive electrode pairs, in alignment, can directly compensate each other against undesired motion in the gap direction, which may be perpendicular to the designed motion direction. In the above exemplary embodiment as shown in FIG. 1-a, for example, the elementary capacitor C11-1 formed by the capacitive electrode 11-1 and the ground electrode 15-1 can form a direct compensation with the elementary capacitor C13-1 composed of the capacitive electrode 13-1 and the ground electrode 16-1. As a result of elementary capacitor direct compensation, the capacitive systems CI and C13 can form direct compensation, and the capacitive systems C12 and C14 can form direct compensation against the undesired motion in the gap direction, which may be perpendicular to the designed motion direction.

The capacitive systems C11 and C12 can be arranged in a differential configuration so that values of (C11-C12) or (C11/C12) can be obtained. The capacitive systems C13 and C14 can be arranged in a differential configuration so that values of (C13-C14) or (C13/C14) can be obtained.

In the above exemplary embodiment, and still referring to exemplary FIG. 1-a, the elementary electrodes of capacitive series 11 and series 12 can all be in the same plane with an allowable small degree of error due to fabrication. Similarly, the elementary electrodes of capacitive series 13 and series 14 can all be in a same plane with an allowable small degree of error due to fabrication and assembly. The elementary electrodes of ground series 15 can all be in the same plane with an allowable small degree of error due to fabrication. Adjacent elementary capacitors can be differentially compensating each other against undesired motion perpendicular to the designed motion direction. In the above exemplary embodiment of FIG. 1-a, the elementary capacitor C11-1 may be constructed by capacitive electrode 11-1 and ground electrode 15-1 to form differential compensation with elementary capacitor C12-1 which in turn can be constructed by capacitive electrode 12-1 and ground electrode 15-1. When the MOVER 106 displaces to the right at the one half point of the repeat cycle for example, the elementary capacitor C12-1 composed of capacitive electrode 12-1 and ground electrode 15-1 could form a differential compensation with elementary capacitor C11-2 which itself is composed of capacitive electrode 11-2 and ground electrode 15-1. As a result of adjacent capacitor compensations the capacitive systems C11 and C12 can form a differential compensation, and the capacitive systems C13 and C14 can form a differential compensation against, for example, undesired motion in the gap direction, that may be perpendicular to the designed motion direction.

In the above exemplary embodiment as shown in FIG. 1-a, multiple capacitive systems can be arranged to form a combination of direct compensation and differential compensation interactions that may optimally reduce the influence of the motion in the gap direction. Capacitive system C11 can simultaneously form direct compensation with capacitive system C13 and differential compensation with capacitive system C12. Capacitive system C12 can simultaneously form direct compensation with capacitive system C14 and differential compensation with capacitive system C11. Capacitive system C13 can simultaneously form direct compensation with capacitive system C11 and differential compensation with capacitive system C14. Capacitive system C14 can simultaneously form direct compensation with capacitive system C12 and differential compensation with capacitive system C13.

The repeating patterns of electrically-conductive electrodes of both the capacitive series and the ground series can be fabricated onto insulated substrates by several techniques. Fabrication techniques include, but are not limited to, printed circuit board (PCB) methods, various thin-film deposition methods, printed electronics methods, or any other known or desired method known to a person of ordinary skill in the art. Exemplary conductive materials for the electrodes include, but are not limited to, copper, silver, gold, aluminum and their alloys, their coatings and inks, or any other desired material or combination of materials known to a person of ordinary skill in the art. Exemplary insulating substrate materials include, but are not limited to, various resin laminates, glasses, ceramics and plastic sheets and tubes, or any other desired material or combination of materials known to a person of ordinary skill in the art.

In the above exemplary embodiment as shown in FIG. 1-b, the widths and lengths of the electrodes of capacitive series 11, 12, 13 and 14 are represented as Wc and Lc. The applicable range of width for Wc may be between 0.001 mm approximately and 200 mm approximately, with an exemplary range of between 0.1 mm approximately and 200 mm approximately. An applicable range of length for Lc is between 0.005 mm approximately and 200 mm approximately, with an exemplary range of between 5 mm approximately and 200 mm approximately. The spaces between electrodes of capacitive series 11 and adjacent electrodes of capacitive series 12 are represented as Wcs. The spaces between electrodes of capacitive series 13 and adjacent electrodes of capacitive series 14 are also Wcs. The applicable range of width for Wcs can be between 0.001 mm approximately and 200 mm approximately. The width and length of the ground series 15 and 16 are represented as Wg and Lg. The spaces between adjacent electrodes of ground series 15 are Wgs. The spaces between adjacent electrodes of ground series 16 are also Wgs. The sum of the width Wg and the space Wgs can be equal to two times of the sum of width Wc and the space Wcs, that is:

$$Wg+Wgs=2*(Wc+Wcs).\qquad\text{[equation 3]}$$

Additionally, in some exemplary embodiments, the width Wg can be equal to or larger than the width Wc, and the width Wg may be equal to or smaller than the sum of width Wc and two times of the space Wcs, that is $$Wc\leq Wg\leq(Wc+2*Wcs).\qquad\text{[equation 4]}$$

In a further exemplary embodiment, the length Lg of the electrodes of ground series 15 and 16 may be smaller than or larger than, but not equal to the length Lc of electrodes of the capacitive series 11, 12, 13, and 14. For example, the length Lg can be about 0.002 mm to about 10 mm larger than or smaller than the length Lc.

In the above exemplary embodiment as shown in FIG. 1-*a*, the electrodes of both the capacitive series and the ground series may be rectangular shapes. It may be appreciated that, in other embodiments, other shapes may be suitable for real applications. As such the electrodes of both the capacitive series and the ground series are not limited to being planar or flat as shown in exemplary FIG. 1-*a*. Exemplary shapes of electrodes illustrated in the following sections are cylindrical or are sections of a cylinder. However, it may be appreciated that the shapes of electrodes can be sections of any of a variety of shapes, for example flat rectangular, flat circular, cylindrical rectangular, flat triangular, flat circular triangular, cylindrical triangular, or any other shape or combination of shapes as desired.

Figure 3:
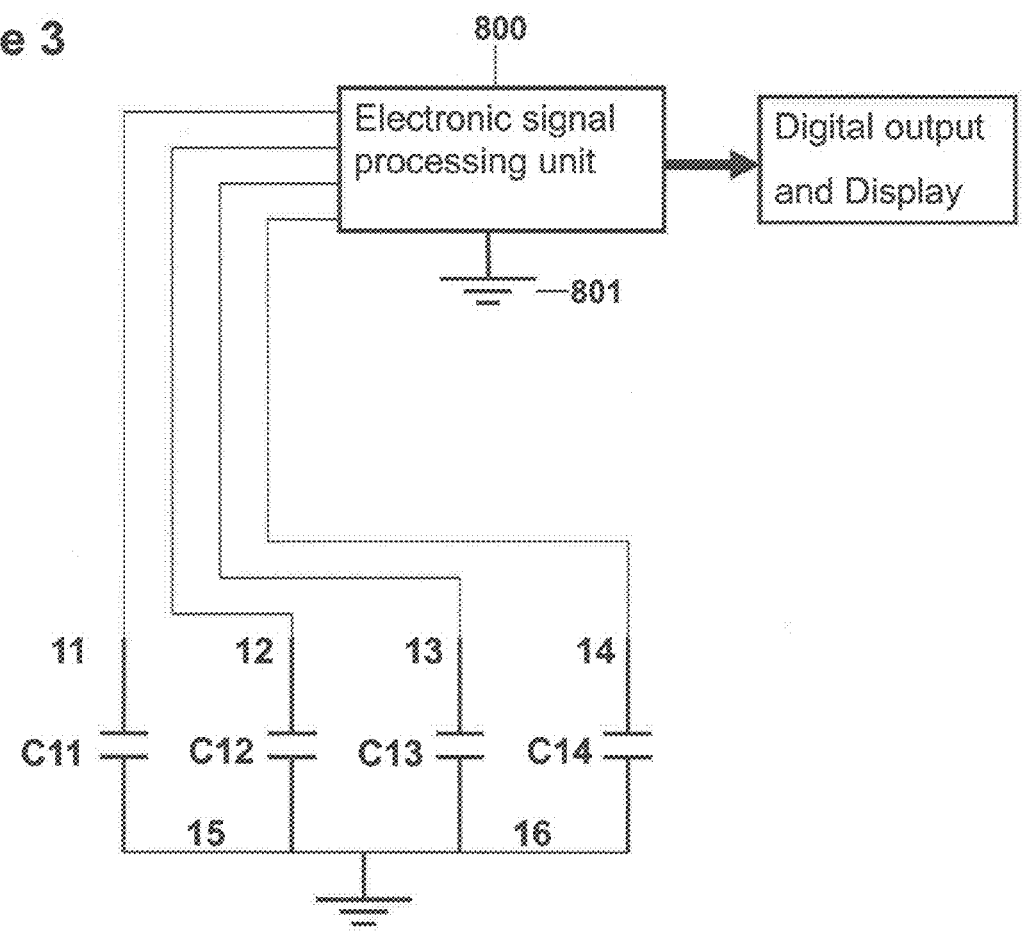
FIG. 3 is an exemplary diagram of an electrical configuration useable for connecting the capacitors, processing unit and output for an embodiment of the invention.

Turning now to the circuitry of a measurement system, in an exemplary embodiment, the capacitive systems C11, C12, C13 and C14 can be connected to an Electronic Signal Processing Unit 800 as shown in exemplary FIG. 3. The grounded electrodes may all be connected to the Processor Ground 801 through various conducting components, as desired. The Electronic Signal Processing Unit 800 may be any desired type of signal processor, including, but not limited to, a signal conditioner, an analog to digital converter, a digital signal processor and the like. The signal processor may further produce a digital output. In the exemplary embodiments, capacitances of capacitive systems C11, C12, C13 and C14 can be independently measured, and there may not be a bridge arrangement. For example, there may be one side of a capacitor, which may be connected directly to ground, as opposed to an excitation source. There may be no bridge excitation circuit applied in such an exemplary embodiment, although the application of such a circuit may be utilized in other embodiments, as desired.

In a direct compensation between C11 and C13, the two capacitive systems may be in a parallel configuration and they can be measured together. So are capacitive systems C12 and C14. Taking the advantage of the parallel configurations, only two independent measurements need be utilized. The measurement circuit can be simplified as shown in exemplary FIG. 4.

Figure 4:
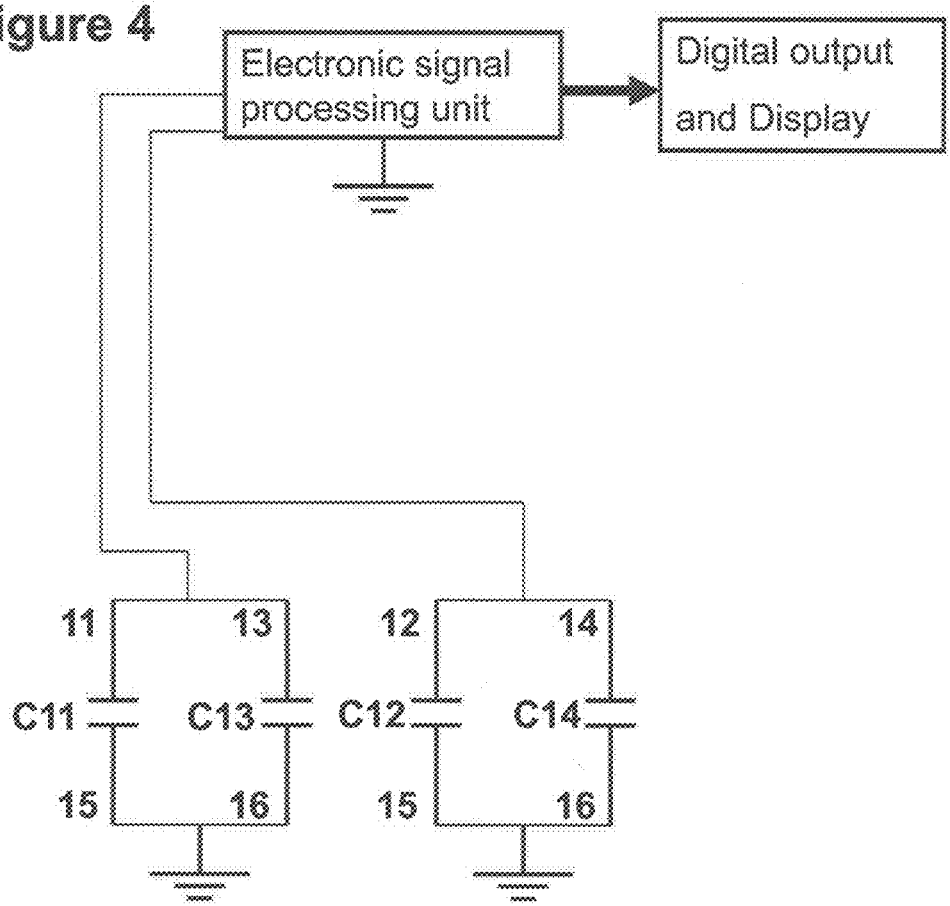
FIG. 4 is an exemplary alternative electrical configuration useable for the capacitors, processing unit and output and is the configuration use for the embodiment shown in FIG. 1-*a*.
Figure 5:
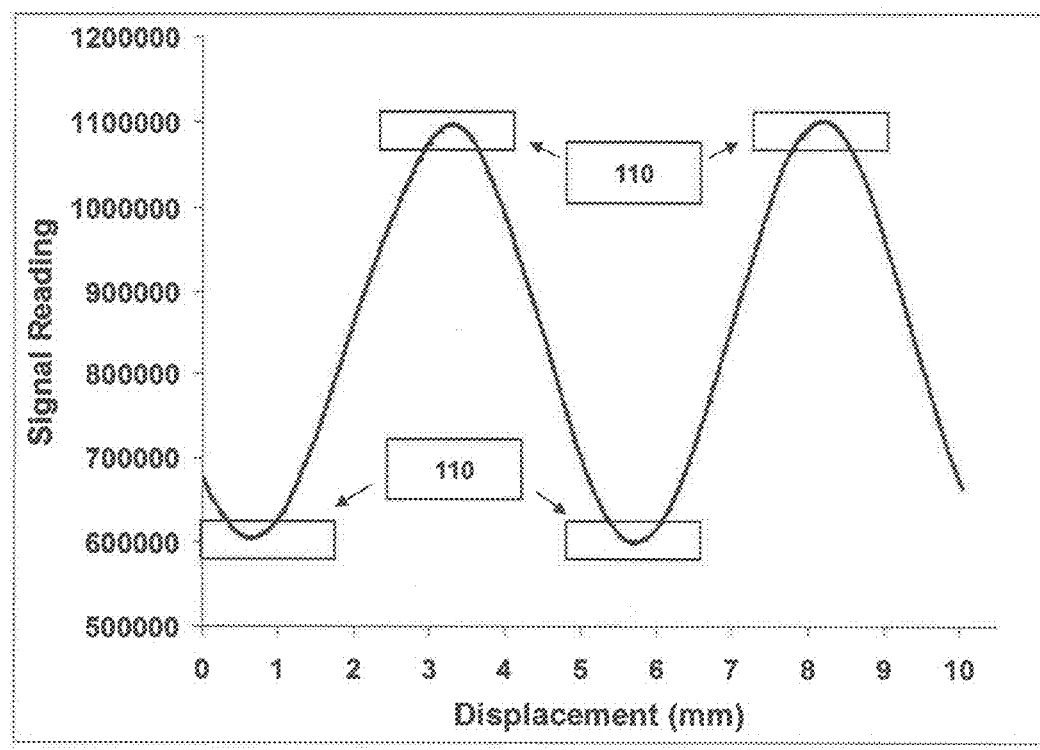
FIG. 5 is an example of the digital output curve of the embodiment shown in FIG. 1-*a* and shows the dead zones in output.

In a further exemplary embodiment, a curve of digital outputs of a sensor system with the geometrical arrangement shown in exemplary FIG. 1-*a* and with the electrical configuration shown in exemplary FIG. 4 is provided in exemplary FIG. 5. The curve can indicate that the output signal has a cyclic behavior, as may be expected. The value of a measured signal can change from increasing to decreasing, and then can change back to increasing. This cyclic behavior can make a long range measurement possible and, in some exemplary embodiments, more sensitive. However, it may also introduce "dead zones" 110 as marked around the transition locations, where the uncertainty of measurement can be unacceptably large. The dead zones can be unavoidable because of the existence of spaces (Wcs) between adjacent elementary electrodes of capacitive series for the differential compensation. For direct compensation, the dead zones may be unavoidable because the edges of electrodes are not able to be made with nanometer precision. Without resolving the dead zone problem, measurement may be limited to less than a half cycles distance.

Thus, using exemplary embodiments described herein, the dead zone problem may be resolved and may allow for making a long range measurement with nanometer accuracy a reality.

Figure 6:
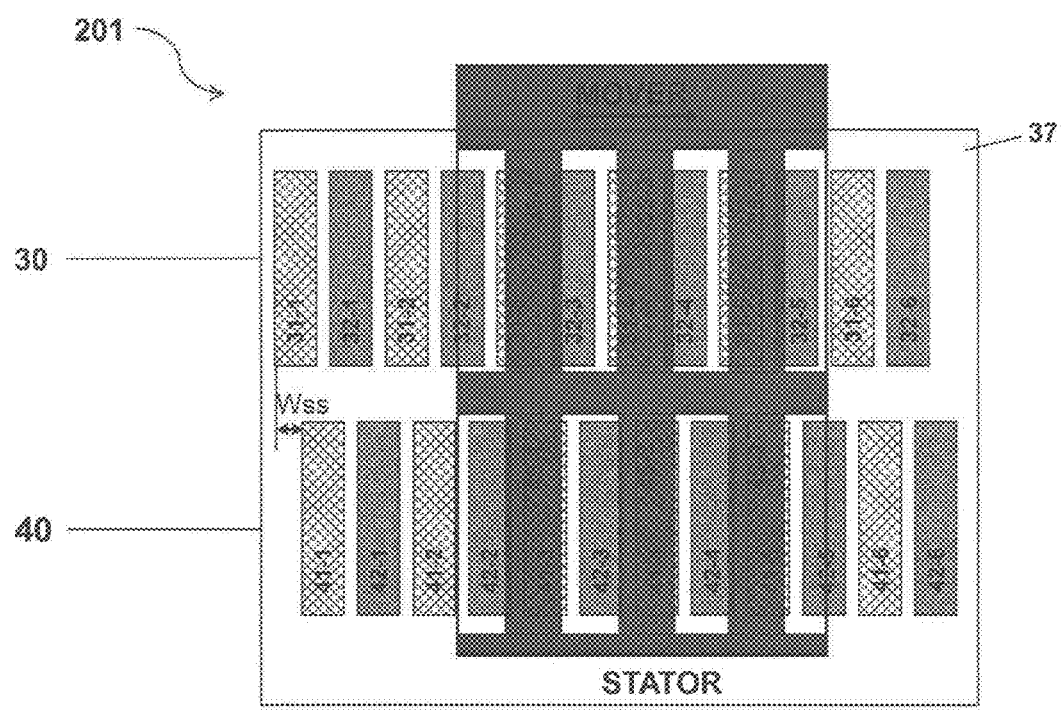
FIG. 6 is an exemplary top down view of one possible embodiment containing one STATOR and one MOVER and showing the geometric configuration of their components.

Referring now to FIG. 6, in one exemplary embodiment that resolves the dead zone problem a Composite Measurement System 201 may be constructed with two capacitive sensor systems, System-1 30 and System-2 40. The System-1 30 and System-2 40 may be substantially similar to the capacitive sensor system 100 described in an exemplary embodiment above or a part of that capacitive sensor system 100. For example, to demonstrate the method of resolving the dead zone problem a simplified version or a part of the capacitive sensor system 100 can be repeatedly applied in the Composite Measurement System 201, and also in the following paragraphs for Composite Measurement Systems 202, 203 and 204.

Referring still to exemplary FIG. 6 and in a further embodiment, the System-1 30 can include: a capacitive series 31 of m elements of substantially equally spaced electrically conductive electrodes 31-1, 31-2, ..., 31-*m*; a capacitive series 32 of m elements of substantially equally spaced electrically conductive electrodes 32-1, 32-2, ..., 32-*m*; and a ground series 35 of n elements of equally spaced electrically conductive electrodes 35-1, 35-2, ..., 35-*n*. For demonstration simplicity the number m of the electrodes of capacitive series 31 and 32 is 6, although it can be any positive integer. Similarly, for demonstration simplicity the number n of the electrodes of ground series 35 is 3, although it can be any positive integer. Capacitive series 31 and 32 can be on the same side of an electrically insulated substrate 37, forming part of a STATOR. Ground series 35 can be on a different electrically insulated substrate, forming part of the MOVER. The MOVER can displace in a substantially parallel manner with respect to the STATOR, which can result in variations of overlap areas between capacitive electrodes and ground electrodes, and variations of capacitances of capacitors C31-1, C31-2, C31-3, C32-1, C32-2, and C32-3. With the kind of geometrical arrangement as described above, capacitive systems C31 and C32 can together form a differential compensation reducing the influence of undesired motion in the gap direction. The elements as described with respect to this exemplary embodiment may also be true for the System-2 40, which can include the capacitive system C41 and C42. The relative geometrical arrangement of the System-1 30 and System-2 40 is illustrated in exemplary FIG. 6. While the ground electrodes of the two systems may be in alignment, the capacitive electrodes of C41 and C42 can be shifted a distance of Wss with respect to the capacitive electrodes of C31 and C32. The value of Wss can be equal to (Wc+Wcs)/2, whereas Wc can be the widths of the electrodes of the capacitive series and Wcs can be the space between adjacent electrodes of the capacitive series.

Figure 7:
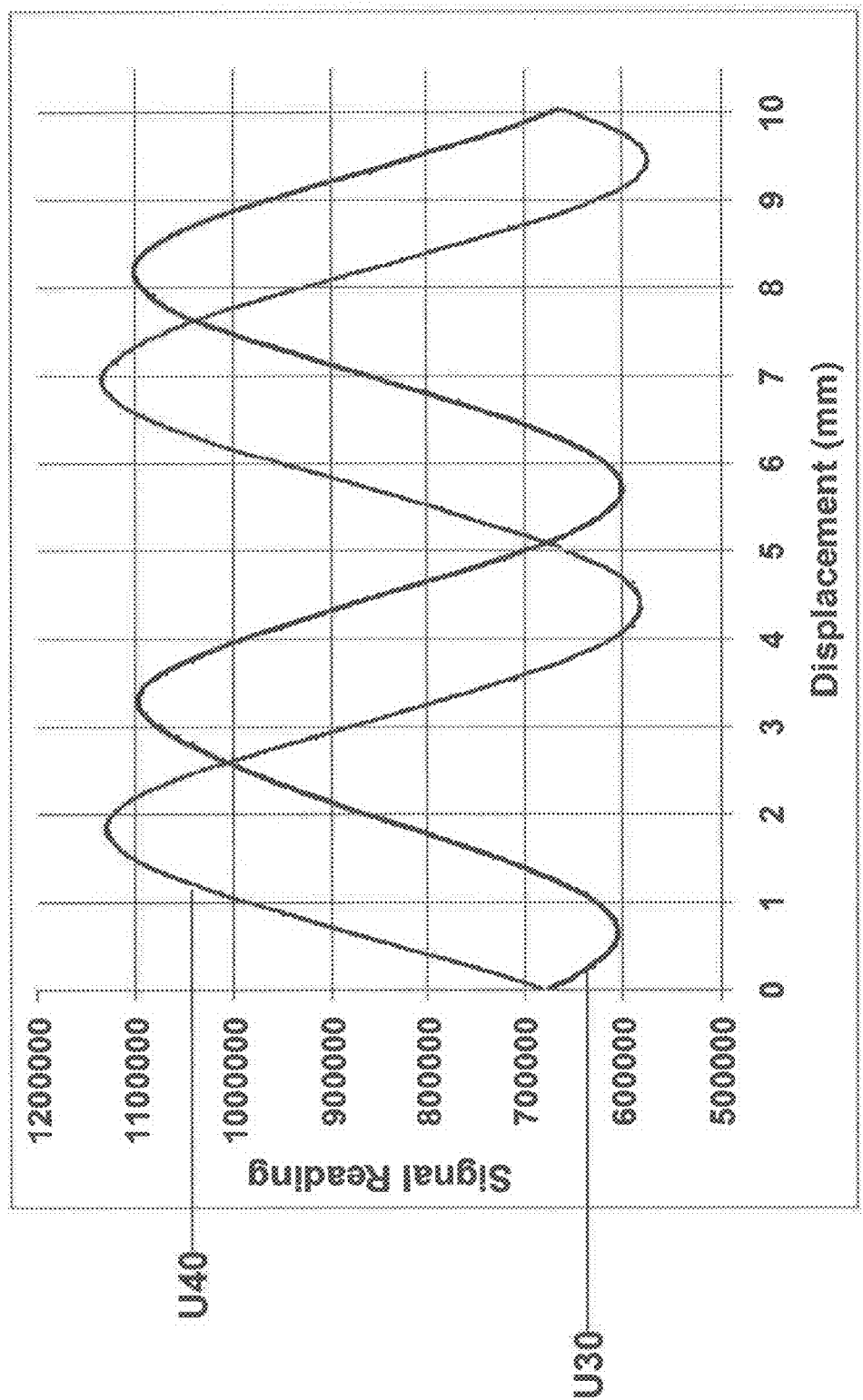
FIG. 7 is an exemplary example of the digital output curves of the embodiment shown in FIG. 6 and how the dead zones have been compensated for by the embodiment.

In a further embodiment, and referring now to exemplary FIG. 7, the Composite Measurement System 201 can output two digital cyclic curves corresponding to the System-1 30 (displaying Curve-1 U30) and System-2 40 (displaying Curve-2 U40). Dead zones may still exist on each of the individual curves, however, as can be seen in exemplary FIG. 7 at the dead zone locations of Curve-1 U30 from System-1 30; Curve-2 U40 from System-2 40 shows good or desired behavior for measurement. Similarly, at the dead zone locations of Curve-2 U40 from the System-2 40; the Curve-1 U30 from System-1 30 shows good or desired behavior for measurement. Therefore a complete measurement may be accomplished by taking good or desired results from System-1 30 and System-2 40 alternatively. In addition, the good behavior sections of both curves can extend in both ends and overlap each other. The overlapped good sections of the two curves can provide a cross-checking function of measurement and make measurements much more reliable.

Figure 8:
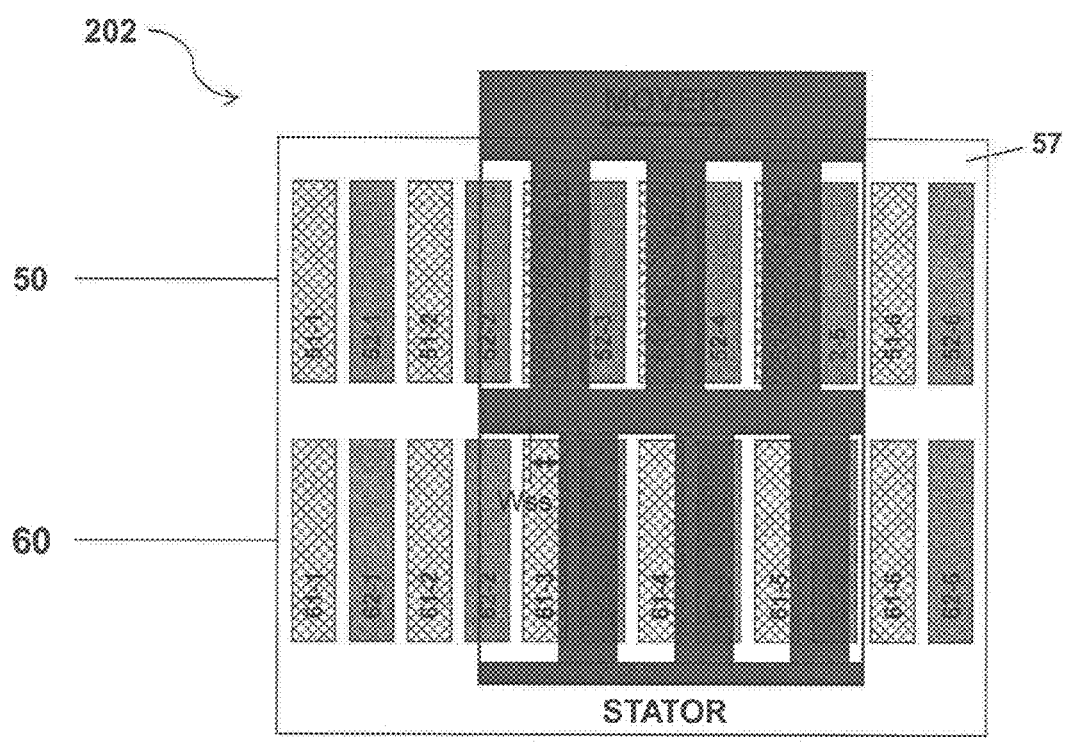
FIG. 8 is an exemplary top down view of one possible embodiment containing one STATOR and one MOVER and showing the geometric configuration of their components.

As an exemplary embodiment FIG. 8 shows a Composite Measurement System 202. In the Composite Measurement System 202, ground electrode series 65 of the System-2 60 may be shifted a distance of Wss with respect to the ground electrode series 55 of System-1 50, while the capacitive electrodes of the systems may be substantially aligned. The value of Wss may be equal to (Wc+Wcs)/2. The Composite Measurement System 202 can output two digital cyclic curves substantially similar to the ones in exemplary FIG. 7.

Figure 9:
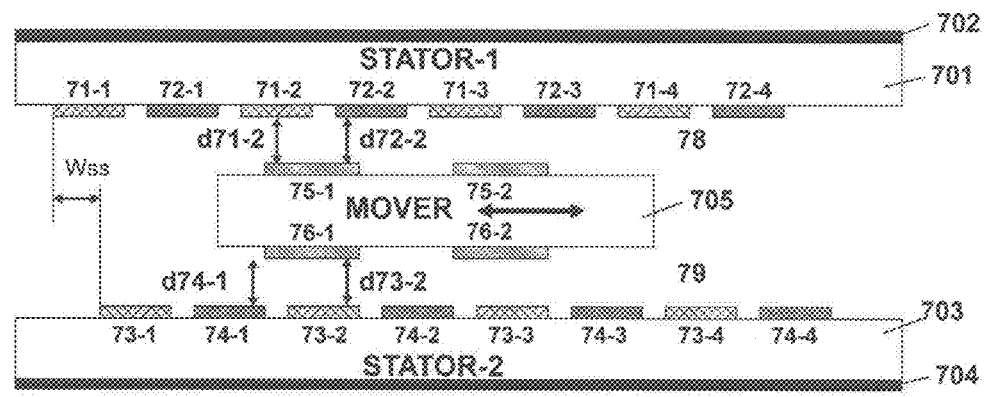
FIG. 9 is an exemplary side view of one possible embodiment containing two STATORs and one double sided MOVER and showing the geometric configuration of their components.

Similar to the composite system 201, as an exemplary embodiment, FIG. 9 shows Composite Measurement System 203. An exemplary difference between the Composite Measurement System 201 and 203 may be the geometrical arrangement. The System-1 78 of the composite system 203 can include: a capacitive series 71 of m elements of equally spaced electrically conductive electrodes 71-1, 71-2, ..., 71-m; a capacitive series 72 of m elements of substantially equally spaced electrically conductive electrodes 72-1, 72-2, ..., 72-m; and a ground series 75 of n elements of substantially equally spaced electrically conductive electrodes 75-1, 75-2, ..., 75-n. For the purposes of simplicity, in this exemplary embodiment, the number m of the electrodes of capacitive series 71 and 72 is 4, although it may be appreciated by one having ordinary skill in the art that it can be any positive integer. Similarly, the number n of the electrodes of the ground series 75 for the sake of simplicity during the demonstration is 2 although it can be any positive integer. The capacitive series 71 and 72 may be on the same side of an electrically-insulated substrate 701 with an electrical shielding 702 on the other side of the substrate, forming STATOR-1. The ground series 75 can be on one side of a different electrically-insulated substrate 705, forming a part of a MOVER. The MOVER can displace in a substantially parallel manner with respect to the STATOR-1, resulting in variations of overlap areas between capacitive electrodes and ground electrodes, and furthermore, the variations of capacitances of capacitors C71-1, C71-2, C72-1, and C72-2. As described earlier with this kind of geometrical arrangement the capacitive systems together may form a differential compensation that reduces the influence of undesired motion in the gap direction. The description of this exemplary embodiment may also be true for System-2 79, that can include capacitive system C73 and C74. Capacitive series 73 and 74 may be on the same side of an electrically-insulated substrate 703 with an electrical shielding 704 on the other side of the substrate forming STATOR-2. STATOR-2 may be fixed substantially parallel to STATOR-1. The ground series 76 can be on the opposite side of the ground series 75 of the electrically-insulated substrate 705 forming another part of the MOVER. The relative geometrical arrangement of the System-1 78 and System-2 79 is illustrated in exemplary FIG. 9. While the electrodes 75-1 and 75-2 of the ground series 75 may be in alignment with the electrodes 76-1 and 76-2 of the ground series 76 respectively; the capacitive electrodes of series C73 and C74 can be shifted correspondingly a distance of Wss with respect to the capacitive electrodes of series C71 and C72. The value of Wss is equal to (Wc+Wcs)/2. Composite Measurement System 203 can output two digital cyclic curves substantially similar to the ones in exemplary FIG. 7.

Figure 10:
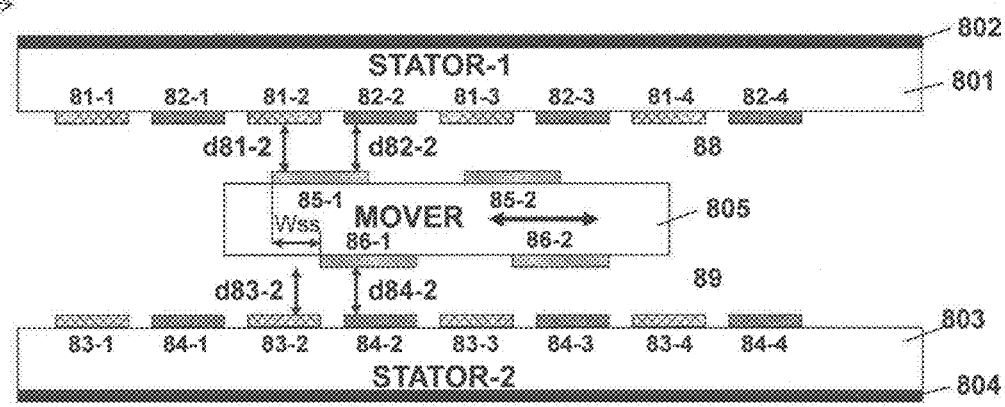
FIG. 10 is an exemplary side view of one possible embodiment containing two STATORs and one double sided MOVER and showing the geometric configuration of their components.

Similar to the Composite Measurement System 203, as an exemplary embodiment, FIG. 10 shows a Composite Measurement System 204 which utilizes the features of Capacitor Sensor System 100 and adds to them the Wss shift as described above in the Composite Measurement System 202. The value of Wss may be equal to (Wc+Wcs)/2. The composite measurement system 204 can output two digital cyclic curves substantially similar to the ones in exemplary FIG. 7.

Figure 11:
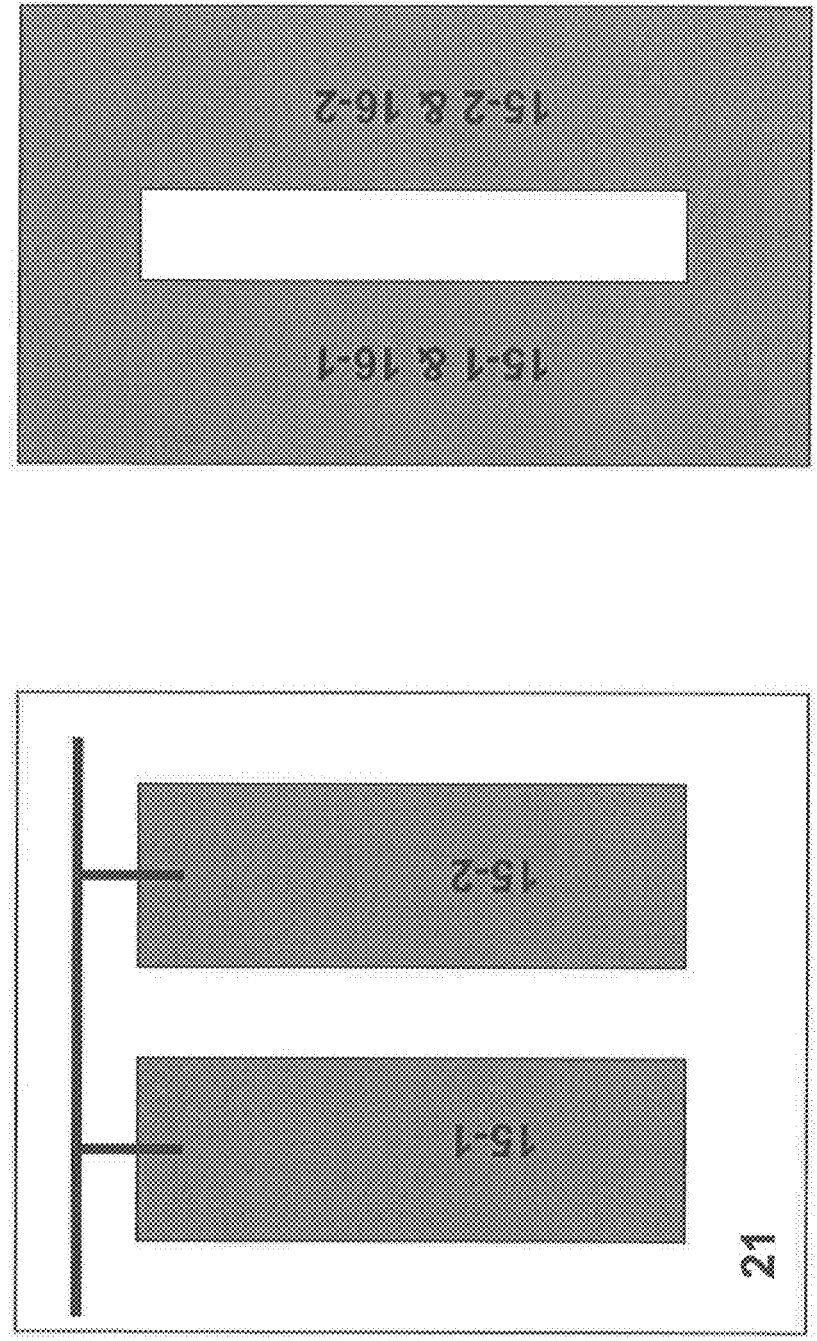
FIG. 11 is an exemplary side by side comparison of two possible embodiments of MOVERs and their components.

For the geometrical arrangements shown in exemplary FIG. 1-a and exemplary FIG. 9, the MOVER can be made simplify from a single conductive sheet of metals, for example, by a wire cutting technique instead of the ones described earlier, although it may be appreciated by a person with ordinary skill in the art that other techniques can be utilized. To illustrate the difference, exemplary FIG. 11 can provide a comparison of these MOVERs with only two electrodes included for each of two ground series. On the left is the kind of MOVER 100 described in earlier exemplary embodiments. Two electrodes 15-1 and 15-2 of a ground series 15 may be on the top side of an electrically-insulated substrate 21, and can be connected through wires to a ground terminal of a measurement system. Additionally it may be noted that there can exist two electrodes 16-1 and 16-2 of another ground series 16 that may be on the bottom side of the substrate 21 which are not shown in exemplary FIG. 11. This kind of MOVER 100 can be fabricated by a PCB technique for example, although any desired technique may be utilized. On the right side of FIG. 11 is the kind of MOVER that can be fabricated from a single conductive sheet of metal by removing a rectangular piece with a wire cutting method or any other desired method known to a person of ordinary skill in the art. The surfaces of the single piece of the conductor can serve as multiple electrodes of ground series 15 and 16. The electrodes may be connected to a ground terminal though other conductive components of the measurement system as desired. Such an exemplary single sheet MOVER may be made very thin, very light and very small so it can make the measurement system have a faster dynamic response behavior, also, it may be useful for mini or micro devices if desired.

The Composite Measurement Systems 201, 202, 203 and 204, as illustrated in exemplary FIGS. 6 and 8-10, respectively, can provide incremental measurements for a long range measurement. A measurement system may lose track of its position each time power is turned off. When power is turned on again the measurement system may need to find or define its home or zero position. Additionally measurement can be relative to a home position as a result of the cyclic nature of the measured signal.

Exemplary FIGS. 12a-c can provide further embodiments of a Composite Measurement System 205 that can provide an absolute measurement, where exemplary FIG. 12a is a stator, exemplary FIG. 12b is a mover and exemplary FIG. 12c is an assembly. Composite Measurement System 205 can be constructed with three capacitive sensor systems, System-1 101, System-2 102, and System-3 103. The pair of System-1 101 and System-2 102 may be utilized for fine measurement. The System-3 103 may be utilized for a coarse measurement. The System-1 101, System-2 102, and System-3 103 may be substantially similar to the ones of Composite Measurement System 202 described above. For the purposes of demonstrating the method of obtaining an absolute measurement only three capacitive sensor systems are used here. Another three more capacitive sensor systems can be added to the Composite Measurement System 205 to optimally form a combination of direct compensation and differential compensation if desired.

The System-1 101 of the composite system 205 can include: 1) a capacitive series 111 of m elements of substantially equally spaced electrically conductive electrodes 111-1, 111-2, ..., 111-m; 2) a capacitive series 112 of m elements of substantially equally spaced electrically conductive electrodes 112-1, 112-2, ..., 112-m; and 3) a ground series 115 of n elements of substantially equally spaced electrically conductive electrodes 115-1, 115-2, ..., 115-n. For the purposes of this exemplary embodiment the number m of the electrodes of capacitive series 111 and 112 is 8, although it can be any positive integer as desired. The number n of the electrodes of the ground series 115 for demonstrative purposes is 4, although it can be any positive integer as desired. The capacitive series 111 and 112 may be on the same side of an electrically insulated substrate 120, forming STATOR-1 107 a part of System-1. The ground series 115 can be fabricated from a single sheet of metal by wire cutting, or any other desired manner, and can form a part of the MOVER 108. The MOVER 108 can displace in a substantially parallel manner with respect to STATOR-1 107, which can result in variations of overlap areas between capacitive electrodes and ground electrodes, and furthermore variations of the capacitances of capacitors C111-1, C112-1, ..., C111-8 and C112-8. Further it may be noted that the description of this exemplary embodiment may also be applied for System-2 102 that can include the capacitive systems C113 and C114, while the electrodes of ground series 116 are shifted a distance of Wss with respect to the electrodes of ground series 115. The value of Wss may be equal to (Wc+Wcs)/2, where Wc is equal to the width of the electrodes of capacitive series 111, and Wcs may be equal to the space between electrodes of the adjacent capacitive series 111 and 112. System-1 101 and System-2 102 together can output two digital cyclic curves substantially similar to those in exemplary FIG. 7.

The System-3 103 can be substantially similar to the capacitive sensor system 101 with the numbers of electrodes of each capacitive series and ground series equal to one. System-3 103 can include two capacitive electrodes 117 and 118 and a single ground electrode 119. The two capacitive electrodes 117 and 118 may be on the electrically-insulated substrate 120, forming a part of STATOR-1 107. The ground electrode 119 may be fabricated together with electrodes of ground series 115 and 116 from a single sheet of metal by wire cutting, or in any other desired manner known by a person of ordinary skill in the art, and can form a part of a MOVER 108. The width Wcl of the capacitive electrodes 117 and 118 and the width Wsl of ground electrode 119 may be designed as:

$$Wcl \leq Wc*m + Wcs*(m-1) \quad \text{[equation 5]}$$

$$Wsl \leq (Wc + Wcs)*m \quad \text{[equation 6]}$$

where Wc is the widths of the electrodes of capacitive series 111 and Wcs is the space between electrodes of the adjacent capacitive series 111 and 112. The System-3 103 may provide a linear curve of reading signal as a function of position.

Additional examples are provided as follows to further illustrate exemplary principles and uses of the embodiments described herein. Such examples may show: 1) direct and differential compensation of capacitive systems to reduce influence of gap variation for area variation sensor, 2) multiple uses of capacitive systems to overcome dead zone problem for long range measurement; and 3) multiple uses of capacitive systems to upgrade measurement from incremental to absolute.

Exemplary FIG. 13-a can demonstrate how a complete sensor system 300 for an absolute linear displacement measurement might be assembled. The STATOR 301 and MOVER 302 may form variable capacitors due to area variation, the system 300 can have a STATOR base 303, a MOVER base 304, two linear bearings 305 and 306, two motion guiders 307 and 308, and four guider supports 311, 312, 313, and 314, although it is envisioned that other embodiments may utilize different quantities of these elements. The MOVER 302 may displace with the MOVER base 304, the two linear bearings 305 and 306, while the STATOR 301 may be fixed on to the stator base 303. The STATOR 301 can have three sets of differential capacitive measuring systems: System-1, System-2 and System-3.

To further illustrate the electrode arrangement of the measuring systems, exemplary FIG. 13-b can show the top view of STATOR 301 and the bottom view of MOVER 302. Each of the three measuring systems can be constructed with electrodes of a pair of two capacitive series and one ground series as described above. Additionally, for the System-3 103 of the coarse measurement, the ground series may be a single electrode of rectangular in shape, and each of the two capacitive series may be triangular in shape. The STATOR and MOVER with electrodes can be fabricated with a PCB technique, or any other desired manner known to a person of ordinary skill in the art.

Exemplary FIG. 14-a and FIG. 14-b show another embodiment of a sensor system 400 for an absolute linear displacement measurement. Although the underlying scientific principles and methods used are the same, this system exemplifies the variety of shapes the electrodes may take. Here electrodes of both capacitive series 401 and 402 and ground series 403 have a cylindrical shape. The capacitive series 401 and 402 are on a cylindrical electrically insulated substrate 404, forming the STATOR of the system. The capacitive series 401 and 402 can be fabricated with a flexible PCB glued to the substrate 404 or by direct electronic printing to the substrate 404, as well as any other method known to a person of ordinary skill in the art. The ground series 403 may be fabricated from a single conductive tube of metal with a wire cutting method or any other method known to a person of ordinary skill in the art, and may be attached to a slider 409. The ground series 403, slider 409 and a shaft 408 on the slider form the MOVER of the system. The substantial parallelism of the motion of the ground series with respect to the capacitive series may be ensured by the linear bearing between the shaft 408 and the cylindrical surface 407 of the substrate 404. In addition, there may be pins 405 that are able to slide in the groove 406 to ensure no rotation occurs during the parallel displacement. The capacitive series 401 and 402 can form capacitors with the ground series 403 with a differential compensation.

The scientific principles used by these exemplary embodiments can be applied to measure an angular displacement. As my first demonstrative example of an angular displacement sensor, two major parts of a sensor system 500, STATOR-1 501 and MOVER 503 are shown in exemplary FIG. 15-a. This example may be used for an absolute angular displacement measurement with a full 360-degree measurement range. You can have a STATOR-2 502 (not shown in FIG. 15-a) in the system 500, which may be similar to STATOR-1 501. The STATOR-1 501 and STATOR-2 502 may be made of PCB with detailed patterns as illustrated in exemplary FIG. 15-b. Each STATOR can have two circles of capacitive electrodes. STATOR-1 501 as shown in FIG. 15-b has as an outer circle of capacitive electrodes which can be used for fine measurement, and which may be constructed with 180 electrodes. Alternating electrodes in STATOR-1 501 may be connected together to form a capacitive series allowing for two capacitive series. This is similar to the way capacitive series 11 and 12 alternated on STATOR-1 104 in FIG. 1-a. STATOR-1 501 as shown in FIG. 15-b has an inner circle which may be used for coarse measurement, and may be constructed with two electrodes. Each of the electrodes can form one capacitive series. Note the shape of all the electrodes in this exemplary embodiment is a circular section with an angular width Wc and radius length Lc, instead of rectangle.

The MOVER 503 with detailed patterns as illustrated in exemplary FIG. 15-c can be fabricated from a single conductive sheet of metal by a wire cutting method, or any other desired method known to a person of ordinary skill in the art. The electrodes on the STATORs can form variable capacitors with the surfaces of the MOVER. To ensure the MOVER rotates in a manner that ground electrodes keep parallel to capacitive electrodes there could be other components to fix the two STATORs and support the MOVER.

The main difference between STATOR-1 501 and STATOR-2 502 may be their orientations. STATOR-1 501 is face up as shown in exemplary FIG. 15-*a*, while the STATOR-2 502 would be facing down if it were shown in the figure. Geometrical arrangement of the STATOR-2 502 with respect to STATOR-1 501 may be similar to the one shown in exemplary FIG. 9 for linear displacement in that the capacitive electrodes may be displaced an angular width Wss. The value of the angle Was is equal to (Wc+Wcs)/2 with that Wc may be the angular width of the electrodes of the capacitive series from a perspective point of the center and Wcs is the angular width of the space between adjacent electrodes of the capacitive series.

Exemplary FIG. 16-*a*, for demonstrative purposes, shows a cross section of a complete angular displacement sensor system 600 for an absolute angular displacement measurement of a full 360-degree measurement range. In addition to the cylindrically shaped components STATOR-1 601, STATOR-2 602, and MOVER 603, the system 600 can have a STATOR base 604, a MOVER base 605, two bearings 607 and 608, and a bearing holder 606. These components may be utilized to keep the rotation in a desired manner so that corresponding electrodes displace in a substantially parallel motion during rotation. The STATOR-1 601 and STATOR-2 602 may be fixed on to the STATOR base 604. The MOVER 603 can rotate with the MOVER base 605 with respect to the STATOR-1 601 and STATOR-2 602 through the bearings 607 and 608.

To further illustrate the electrode arrangement of the measuring systems, exemplary FIG. 16-*b* shows the cylindrical STATOR-1 601, STATOR-2 602 and MOVER 603 in an unassembled configuration. The STATOR-1 601 can have an electrically insulated cylindrical substrate and four series 611, 621, 612, and 622 of 45 elements of equally spaced electrically conductive electrodes connected together alternatively. The shape of the capacitive electrodes may be a sector of a cylinder. The STATOR-2 602 can have an electrically insulated cylindrical substrate and three capacitive electrodes 613, 614 and 617. The shape of these two electrodes 613 and 614 may be a triangular sector of a cylinder. The shape of the electrode 617 may be a sector of a cylinder.

The MOVER 603 can include an electrically insulated cylindrical substrate, two ground series 615 and 616 of about 45 elements of substantially equally spaced electrical-conducting electrodes on the inner surface, and two ground electrodes 618 and 619 on the outer surface. Upon assembly, about seven variable capacitors or composite capacitors can be formed from capacitive electrodes with ground electrodes. They may be composite capacitors C611 from the capacitive series 611 with ground series 615; C621 from 621 and 615; C612 from 612 with 616; C622 from 622 with 616; capacitors C613 from the 613 with 618; C614 from 614 with 618; and C617 from 617 with 619. Differential compensations can be formed between C611 and C621, and between C612 and C622 for fine measurements, and between C613 and C614 for a coarse measurement. For the relative geometrical arrangement of 611, 621, 612, and 622 for the fine measurements, the ground electrodes may be in alignment while the capacitive electrodes are rotationally shifted an angular width Wss. The value of the angle Wss can be equal to (Wc+Wcs)/2 where Wc can be the angular width of the electrodes of capacitive series from the perspective of the center and Wcs can be the angular width between adjacent electrodes of the capacitive series from the perspective of the center. The function of the capacitor C617 may be to define the position of zero degree.

The foregoing description and accompanying figures illustrate the preferred embodiments and modes of operation of the invention. However, the invention should not be construed as being limited to the particular embodiments discussed above. Additional variations of the embodiments discussed above will be appreciated by those skilled in the art.

Therefore, the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. A composite capacitive displacement measurement system comprising:
   one or more composite components (STATORs) that are stationary with respect to a predetermined system, and each of the composite components comprising:
     an electrically insulated substrate having at least two pairs of electrically conductive capacitive electrodes located a predetermined distance from one another, where the electrodes are alternatively electrically connected together to form at least two capacitive series;
   one or more composite components (MOVERs) that are mobile and move in a controlled manner with respect to the predetermined corresponding components that are stationary relative to the system, wherein the controlled manner of moving is facilitated by bearings that allow for travel in a direction parallel to surface of the electrodes and also in a direction parallel to the alternating direction of the electrodes, and each of the components comprising:
     an electrically insulated substrate having at least one ground series of electrically conductive ground electrodes located a predetermined distance from one another, where the ground electrodes are electrically connected together to form a ground series;
   one or more circuits comprising:
     an electronic signal processing unit;
     a ground;
     conducting components connecting the ground series to the ground; and
     conducting components connecting the capacitive series to the electronic signal processing unit
   further comprising variable capacitors created by electrodes of the capacitive series with elementary electrodes of ground series, where the capacitors from electrodes of different STATORs are arranged in one or more superposition configurations;
   and one or more corresponding capacitive series of electrodes on the different STATORs are substantially aligned, and one or more corresponding ground series of electrodes on MOVERs are substantially aligned.

2. A composite capacitive displacement measurement system as in claim 1, further comprising:
   variable capacitors created by electrodes of the capacitive series with elementary electrodes of ground series, where the corresponding capacitors from electrodes of same STATORs are arranged in one or more differential configurations;
   and one or more corresponding series of electrodes on the same STATORs are substantially in the same plane.

3. A composite capacitive displacement measurement system as in claim 1, further comprising:
variable capacitors created by electrodes of the capacitive series with elementary electrodes of ground series, where the corresponding capacitors from electrodes of same STATORs are arranged in one or more differential configurations;
and one or more corresponding series of electrodes on the same STATORs are substantially in the same plane.

4. A composite capacitive displacement measurement system as in claim 1, wherein one or more of the composite components containing electrodes has electrical shielding on at least one of a side and back of the electrically insulated substrate where no electrodes are located.

5. A composite capacitive displacement measurement system as in claim 1, wherein the electrodes in one or more STATORs are substantially similar to other electrodes in the one or more STATORs, and the electrodes in one or more MOVERs are substantially similar to other electrodes in the one or more MOVERs.

6. A composite capacitive displacement measurement system as in claim 1, wherein the electrodes are formed with at least one of a flat rectangular section, a flat circular section, a cylindrical rectangular section, a flat triangular, a flat circular triangular section and a cylindrical triangular section.

7. A composite capacitive displacement measurement system as in claim 6, wherein $(Wg+Wgs)=2*(Wc+Wcs)$, $Wcs \leq Wc$ and $Wc \leq Wg \leq (Wc+2*Wcs)$ for electrodes with shape of the flat rectangular, flat circular section, and cylindrical rectangular section, where the Wg and Wc are the width or angular width of ground and capacitive electrodes, Wgs and Wcs are the spaces or angular spaces between adjacent electrodes of the ground and capacitive series.

8. A composite capacitive displacement measurement system as in claim 6 wherein a length Lg of the ground electrodes is either larger or smaller than length Lc of the capacitive electrodes, but not equal to Lc ($Lc \neq Lg$).

9. A composite capacitive displacement measurement system as in claim 6, wherein, for linear displacement, the range of capacitive electrodes width Wc is between about 0.001 mm and about 200 mm, the range of spaces Wcs between adjacent capacitive electrodes is between about 0.001 mm and about 200 mm, and the range of capacitive electrodes length Lc is between about 0.005 mm and about 200 mm.

10. A composite capacitive displacement measurement system as in claim 6, wherein for angular displacement the range of capacitive electrodes angular width Wc is between about 0.001° and about 180°, the range of angular spaces Wcs between adjacent capacitive electrodes is between about 0.001° and about 270°, and the range of capacitive electrodes length Lc is between about 0.005 mm and about 200 mm.

11. A composite capacitive displacement measurement system as in claim 1, wherein one or more of the composite components are manufactured from a printed circuit board (PCB) method, a various thin-film deposition method, and a printed electronics method.

12. A composite capacitive displacement measurement system as in claim 1, wherein one or more MOVERs are manufactured from one of a single sheet of metal or tube of metal.

* * * * *